United States Patent [19]

Standley

[11] Patent Number: 5,381,054
[45] Date of Patent: Jan. 10, 1995

[54] MULTIPLE INPUT COMPARATOR CIRCUIT FOR A SWITCHED RESISTIVE NETWORK

[75] Inventor: David L. Standley, Westlake Village, Calif.

[73] Assignee: Rockwell International Corporation, Seal Beach, Calif.

[21] Appl. No.: 163,315

[22] Filed: Dec. 7, 1993

[51] Int. Cl.$^6$ ............................................. H03K 5/24
[52] U.S. Cl. ..................................... 327/82; 323/281; 327/63; 327/65
[58] Field of Search .............. 307/364, 355, 497, 491, 307/494; 330/257, 288; 323/281, 315

[56] References Cited

U.S. PATENT DOCUMENTS

| 4,388,539 | 6/1983 | Boeke | 330/257 |
| 4,590,391 | 6/1986 | Valley | 307/364 |
| 4,743,779 | 5/1988 | Valley | 307/360 |
| 4,849,661 | 7/1989 | Bazes | 323/281 |
| 5,218,440 | 6/1993 | Mathur | 382/14 |

OTHER PUBLICATIONS

T. Delbrück, "'Bump' Circuits for Computing Similarity and Dissimilarity of Analog Voltages," IEEE International Joint Conference on Neural Networks, Seattle, Wash., vol. 1, pp. I-475-479 (Jul. 8-12, 1991).
P. C. Yu et al., "CMOS resistive Fuses for Image Smoothing and Segmentation," IEEE Journal of Solid-State Circuits, vol. 27, No. 4, pp. 545-553 (Apr. 1992).
J. G. Harris, "Analog Models for Early Vision," Ph.D. Thesis, California Institute of Technology, pp. 41-49 and 61-64 (May 1991).

Primary Examiner—Timothy P. Callahan
Assistant Examiner—Terry L. Englund
Attorney, Agent, or Firm—John C. McFarren

[57] ABSTRACT

A comparator circuit, for a switched resistive network which may be combined with a transconductance amplifier, simultaneously and independently compares a plurality of input voltages to a reference voltage. The circuit comprises a current splitter having a current input, a plurality of comparator outputs, and a corresponding plurality of voltage inputs that control the fraction of the input current available at each comparator output. A reference output of the current splitter is provided as an input to a current mirror, and each of the comparator outputs of the current splitter is connected to a corresponding output of the current mirror. The current available at each of the current mirror outputs is a function of the reference input provided from the current splitter. The comparator circuit needs only one bias input and one reference input. The inclusion of a second biasing device with an associated mirror device produces a transconductance amplifier combined with the comparator circuit. This combination minimizes the integrated circuit area required for transconductors and comparators on image processing chips.

13 Claims, 3 Drawing Sheets

MULTIPLE INPUT COMPARATOR CIRCUIT FOR A SWITCHED RESISTIVE NETWORK

TECHNICAL FIELD

The present invention relates to electronic comparator circuits and, in particular, to a comparator circuit for a switched resistive network in which a plurality of inputs are simultaneously and independently compared to a reference input.

BACKGROUND OF THE INVENTION

Special propose analog processors have been previously developed for computationally intensive machine vision tasks such as edge detection and noise point removal. Such processors can be implemented on a single VLSI chip using a standard CMOS fabrication process. Generally, they are compact, low cost, low power systems that can accept raw image data and provide a digital output (such as an edge map), a processed gray-level image, or both. Many of these chips include an array of photodetectors so that an image can be focused directly onto the surface of the die. Other versions allow external data to be scanned in, as from an infrared focal-plane array, for example. The resolution is limited primarily by the fabrication process linewidth, the maximum die size, and the circuit design.

Image smoothing, which can be implemented with a resistive grid, is generally the first step in edge detection. At any given pixel, the presence of an edge can be determined by comparing various quantities at or near that pixel. The difference between two adjacent pixels of a smoothed image can be used to detect an edge. If the absolute value of this difference exceeds a certain threshold, an edge is declared. This can be done on an image processor chip with a voltage comparator. The brightness at each pixel is represented by a voltage source, and the smoothed voltage appears on the resistor network (or "grid"). The resistors connecting adjacent pixels can be denoted Hres ("horizontal" resistors), and those connecting the data source to the smoothed node can be denoted Vres ("vertical" resistors), the nature of the smoothing being determined by their i-v curves. The comparator at a pixel opens a switch in series with the Hres if and only if the voltage across the Hres (of either sign) exceeds a certain threshold, corresponding to a reasonably definite edge. The network, however, has hysteresis: when a switch opens, the comparator voltage increases even further. To assure a unique solution for each image frame, the thresholds must be raised temporarily (to close all the switches) and then gradually lowered. Thus, the strongest edges get detected first. Once the edges are found, the network provides a smoothed and segmented image in which edges remain sharp while fixed-pattern noise is smoothed out.

The Hres, comparator, and switch of a machine vision network can be thought of as a single, two-terminal element that functions as a resistive fuse. Known transistor circuits with a fuse-like response have varying degrees of adjustability. Many of such known circuits, however, do not break abruptly when the voltage exceeds a threshold, which is why standard CMOS versions tend to be bulky. Although there are some relatively compact circuits that have adjustable thresholds and break abruptly, edge detection and image segmentation networks built from these fuses all have the property that separate sets of transistors are used for the Vres and the Hres fuse blocks. A Vres circuit is typically built using a differential-input transconductance amplifier connected as a unity-gain buffer and run in subthreshold mode to give a high closed-loop output impedance.

Because of the limitations of prior art circuits, an improved comparator and transconductor circuit design is needed for (1) edge detection and image smoothing/segmentation networks, and (2) outlier (or noise point) detection and removal networks. In particular, a multiple input comparator/transconductor circuit is needed to provide effective performance in machine vision networks while conserving processor chip area per pixel.

SUMMARY OF THE INVENTION

The present invention comprises a comparator circuit for a switched resistive network that simultaneously and independently compares a plurality of input voltages to a reference voltage. The comparator circuit comprises a current splitter having a current input, a plurality of comparator outputs, and a corresponding plurality of voltage inputs that control the fraction of the input current available at each comparator output. A reference output of the current splitter is provided as an input to a current mirror, and each of the comparator outputs of the current splitter is connected to a corresponding output of the current mirror. The current available at each of the current mirror outputs is a function of the reference output provided by the current splitter. The comparator circuit needs only one bias input and one reference input. The inclusion of a second biasing device (and associated mirror device) produces a transconductance amplifier combined with the comparator circuit. This combination minimizes the integrated circuit area required for transconductors and comparators on image processing chips.

A principal object of the invention is reduction of integrated circuit area required for comparator circuits and transconductance amplifiers. A feature of the invention is a comparator circuit comprising a current mirror connected to a current splitter having one bias input and one reference input. An advantage of the invention is a multiple input comparator circuit for a switched resistive network that can function as a transconductance amplifier with the inclusion of a second biasing device.

BRIEF DESCRIPTION OF THE DRAWINGS

For a more complete understanding of the present invention and for further advantages thereof, the following Detailed Description of the Preferred Embodiments makes reference to the accompanying Drawings, in which.

DETAILED DESCRIPTION OF THE PREFERRED EMBODIMENTS

Figure 1:
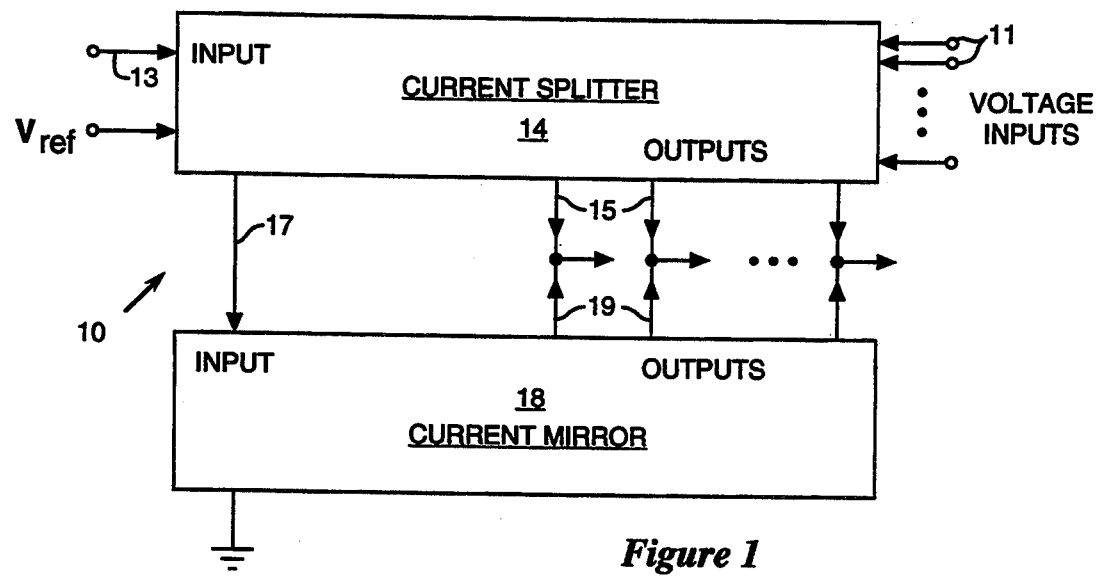
FIG. 1 is a schematic block diagram of a multiple input comparator circuit of the present invention illustrating a current splitter connected to a current mirror.

The present invention allows a plurality of electronic signal comparators having a common reference input to be combined into a unitary circuit that requires only a single biasing device and a single reference input device. The circuit maintains substantial independence among the comparators while conserving integrated circuit area. As illustrated in FIG. 1, the present invention comprises a comparator circuit 10 that simultaneously and independently compares a plurality of voltage inputs 11 to a reference voltage $V_{ref}$. The circuit comprises a current splitter 14 having a current input 13, a plurality of comparator outputs 15, and the corresponding plurality of voltage inputs 11 that control the fraction of the input current 13 available at each comparator output 15. A reference output 17 of current splitter 14 is provided as an input to a current mirror 18, and each of the remaining comparator outputs 15 of current splitter 14 is connected to a corresponding output 19 of current mirror 18. The current available at each of the current mirror outputs 19 is a function of the reference output 17 provided by current splitter 14. Because comparator circuit 10 needs only one bias input and one reference input, the integrated circuit area required for circuit 10 on image processing chips is minimized.

Figure 2:
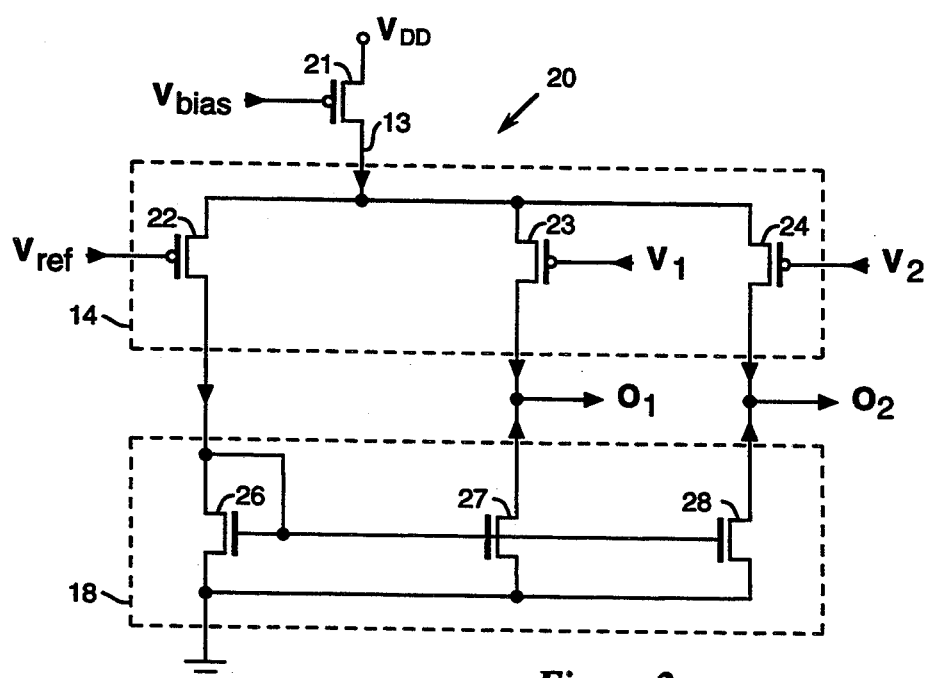
FIG. 2 is a schematic diagram illustrating a basic embodiment of the comparator circuit of FIG. 1.

FIG. 2 illustrates a comparator circuit 20 comprising a basic embodiment of the present invention. In FIG. 2, the current splitter 14 and current mirror 18 sections of circuit 20 are designated by dotted line boxes surrounding the corresponding circuit elements. Input current 13 is provided to current splitter 14 of circuit 20 from power supply $V_{DD}$ through transistor 21 controlled by $V_{bias}$. Transistor 21 is joined by a common-source connection to transistors 22, 23, and 24, which form current splitter 14. In a preferred embodiment of circuit 20, transistors 22, 23, and 24 comprise p-FETs, and transistors 26, 27, and 28 of current mirror 18 comprise n-FETs, as illustrated in FIG. 2.

A special case of circuit 20 exists when the parameters of transistors 22, 23, 24, 26, 27, and 28 are the same. In the ideal case, where the comparator transistor thresholds are matched (at least among transistors 22–24 and 26–28) and there is no output conductance, voltages at the drains of transistors 27 and 28 depend on the signs of $V_{ref}-V_1$ and $V_{ref}-V_2$, respectively. As a result, the voltage at output $O_1$ is pulled near ground whenever $V_{ref}-V_1$ is negative and is pulled near the common source voltage of transistors 22, 23, and 24 whenever $V_{ref}-V_1$ is positive. This is true regardless of $V_2$. Although transistors 24 and 28 take current away from the differential pair of transistors 22 and 23, this current is limited by the drain current of transistor 22 (because of the mirror pair of transistors 26 and 28). Thus, there is always a minimum current, as a fraction of input current 13, that operates the pair of transistors 22 and 23. Likewise, the voltage at output $O_2$ is essentially independent of $V_1$. In operation of circuit 20, common-mode ranges must be assumed. Any means for reading the comparator outputs must distinguish between a near-ground voltage and a voltage dependent on the lowest possible voltage of $V_1$, $V_2$, and $V_{ref}$. The comparator outputs, of course, depend on the parameters of transistors 21–28 and the bias voltage $V_{bias}$.

Figure 3:
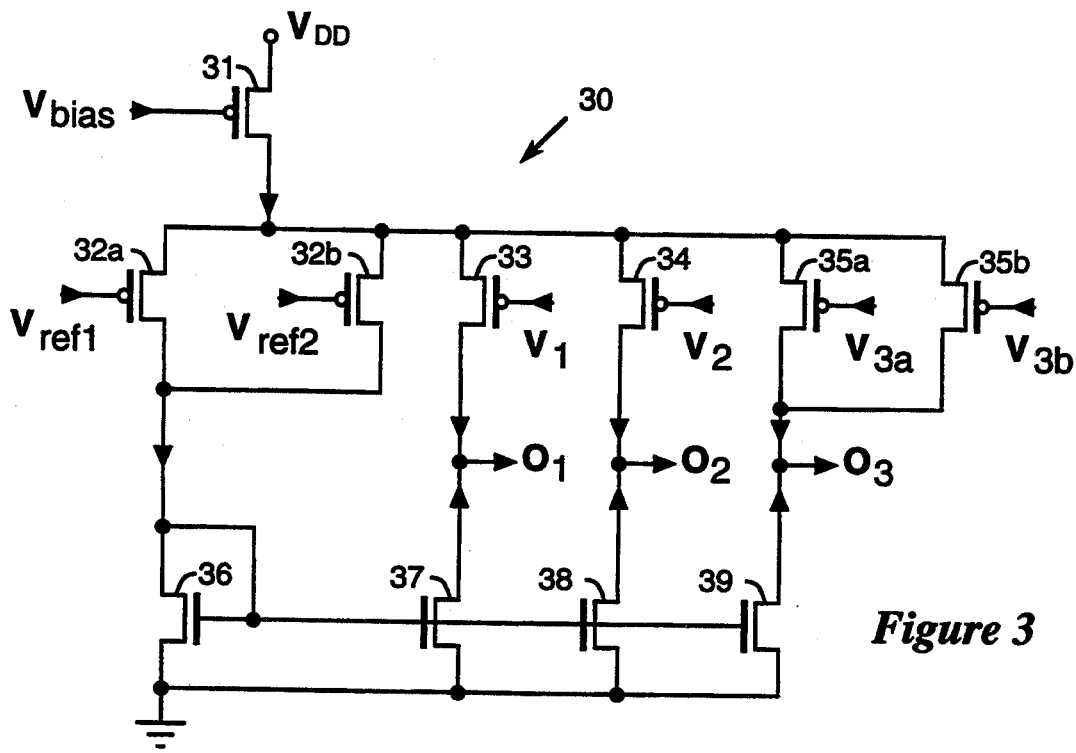
FIG. 3 is a schematic diagram illustrating an alternative embodiment comprising a modification of the circuit of FIG. 2.

FIG. 3 illustrates a modification of the basic comparator circuit of FIG. 2. Comparator circuit 30 includes two reference voltage inputs, $V_{ref1}$ and $V_{ref2}$; three comparator outputs, $O_1$, $O_2$, and $O_3$; and two inputs, $V_{3a}$ and $V_{3b}$, for the third comparator. In circuit 30, a weighted average of the two reference voltages is compared to $V_1$, $V_2$, and a weighted average of $V_{3a}$ and $V_{3b}$. Circuit 30 illustrates that any number of comparator outputs are possible, each representing a comparison of two quantities (i.e., input voltage and reference voltage), wherein each quantity is a single voltage or an average of two or more voltages. In general, averages are subject to large-signal nonlinearities. In circuit 30, for instance, a lower voltage gets weighted more heavily than a higher voltage.

Figure 4:
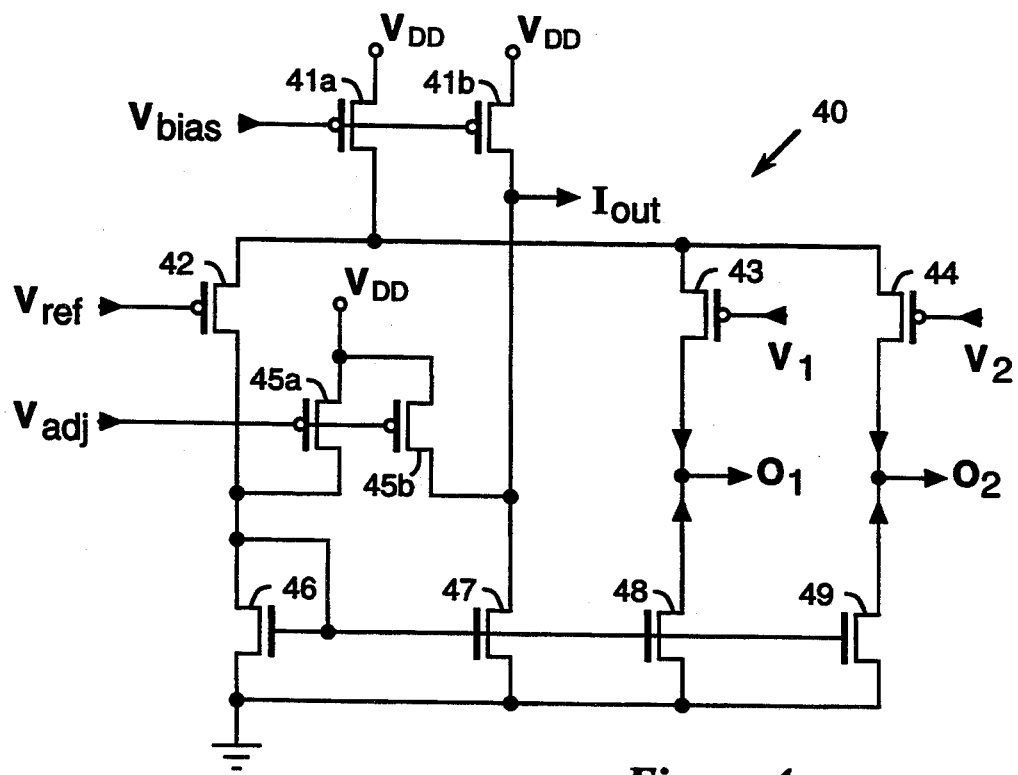
FIG. 4 is a schematic diagram illustrating a comparator circuit of the present invention combined with a transconductance amplifier.

FIG. 4 illustrates another modification of the basic comparator circuit of FIG. 2. Circuit 40 comprises circuit 20 with additional transistors that provide threshold adjustability and a transconductance output. The drain current through transistor 45a, regulated by adjustment voltage $V_{adj}$, is added to the current through transistor 42, thereby increasing the thresholds for $V_{ref}-V_1$ and $V_{ref}-V_2$. The amount of the threshold increase depends on the ratio of the drain currents of transistors 42 and 45a (it also depends on $V_{bias}$ with above-threshold transistor operation). With adjustability, however, some degree of threshold independence between the comparators is lost: as $V_{ref}-V_1$ starts out below threshold and is then increased, the threshold for $V_{ref}-V_2$ increases with it. This loss of independence is acceptable in some applications of comparator/transconductor circuit 40.

Circuit 40 also includes a transconductance output $I_{out}$ through the drains of transistors 41b and 47. Transistor 45b can be used to reject the effect of the threshold adjustment (i.e., the drain current of transistor 45a mirrored through transistors 46 and 47) on the output current $I_{out}$. Output current $I_{out}$ is a byproduct obtainable from basic comparator circuit 20 with the simple addition of a second bias transistor 41b and its associated mirror transistor 47.

Figure 5:
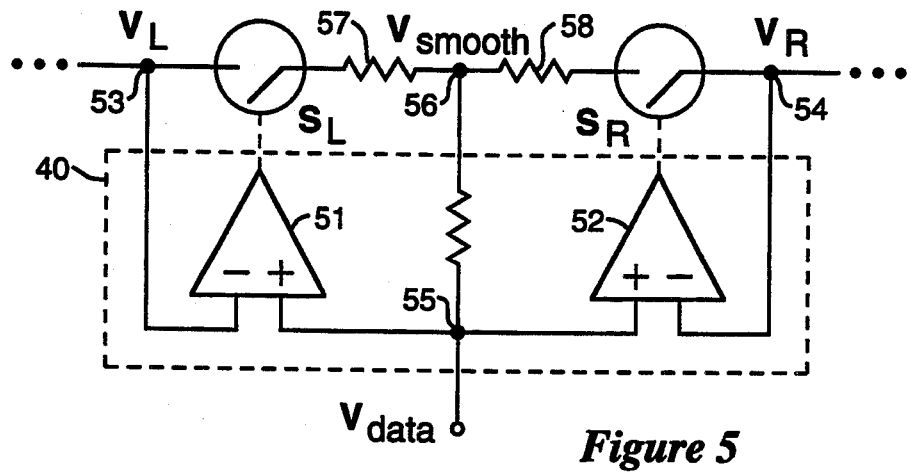
FIG. 5 is a schematic block diagram of a unit cell of a one-dimensional resistive smoothing network for machine vision edge detection and image segmentation.

FIG. 5 illustrates a unit cell (i.e., for one pixel) of a simplified one-dimensional resistive smoothing network for machine vision edge detection and image segmentation. Although described, for simplicity, in terms of one-dimensional imaging, this network is easily adaptable for two-dimensional edge detection and segmentation. At each pixel, there are two comparators 51 and 52, one between the data node 55 and each cell boundary node 53 and 54. The voltages at boundary nodes 53 and 54 comprise smoothed, "intermediate" voltages $V_L$ and $V_R$, between adjacent left and right pixels, respectively. Resistors 57 and 58 comprise horizontal resistors (Hres) between nodes in the network. Comparators 51 and 52 are one-sided in that they open switches $S_L$ and/or $S_R$, respectively, only if $V_{data}$ exceeds intermediate voltages $V_L$ and/or $V_R$ by a certain threshold. If $V_{data}$ is less than an intermediate voltage, the corresponding switch remains closed. This network functions like a Vres (vertical resistor) voltage edge detector in that comparators 51 and 52 use a similar difference signal for detection, so that sensitivity is not degraded with large amounts of smoothing. The network also functions like a fuse network in that edge orientation (e.g., horizontal vs. vertical in a two-dimensional implementation) is preserved, and the boundaries of small dark regions can be filtered out of the edge map (depending on the amount of smoothing). In addition, this scheme allows the sign of a voltage gradient to be read out (e.g. in the +x or −x direction). As illustrated by the dotted line box surrounding comparators 51 and 52, circuit 40 of FIG. 4 can perform the comparator function for the unit cell.

Figure 6:
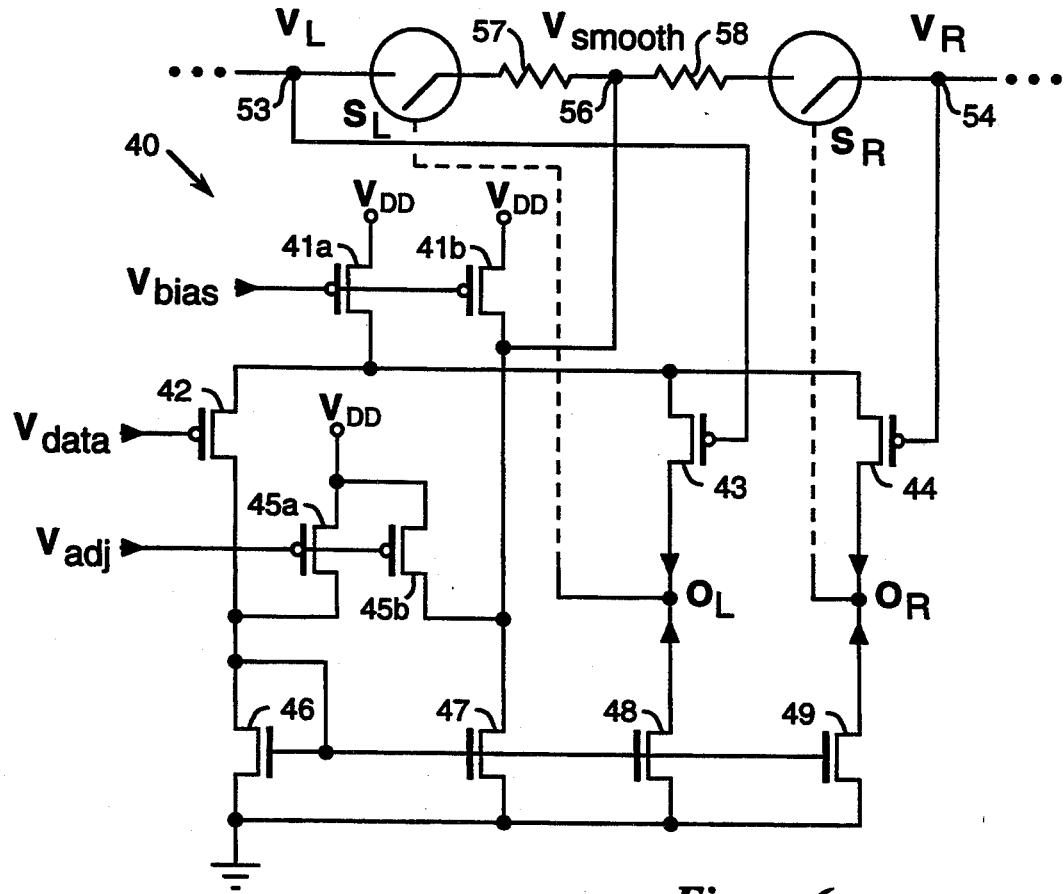
FIG. 6 is a schematic diagram illustrating the comparator/transconductor circuit of FIG. 4 in conjunction with the resistive network of FIG. 5.

FIG. 6 is a schematic block diagram of the resistive network unit cell of FIG. 5 connected to comparator/transconductor circuit 40 of FIG. 4. In the circuit of FIG. 6, $V_{data}$ comprises the reference voltage input to the gate of transistor 42. The Vres current of circuit 40 (i.e., $I_{out}$ in FIG. 4) is connected to provide smoothing voltage $V_{smooth}$ to pixel node 56. The gates of transistors 43 and 44 are connected, respectively, to boundary cell nodes 53 and 54 to receive intermediate voltages $V_L$ and $V_R$. In an alternative embodiment, the gates of transistors 43 and 44 can be connected to the $V_{smooth}$ nodes of the adjacent left and right pixels, respectively. The outputs $O_L$ and $O_R$ at the drains of transistors 48 and 49, respectively, operate switches $S_L$ and $S_R$, respectively, connected in series with Hres resistors 57 and 58. Switches $S_L$ and $S_R$ remain closed when the corresponding drain voltages are near ground. The threshold adjustment voltage $V_{adj}$ at the gates of transistors 45a and 45b can be used to force switches $S_L$ and $S_R$ to close temporarily when processing a new frame of image data. In a typical embodiment, Hres resistors 57 and 58 and switches $S_L$ and $S_R$ are implemented with transistor circuitry as is well known in the art.

The circuit of FIG. 6 behaves somewhat differently from the cell block depicted in FIG. 5. In the cell block of FIG. 5, the Vres current depends on $V_{data}$ minus $V_{smooth}$. However, the Vres current through circuit 40 (i.e., $I_{out}$ in FIG. 4) depends on $V_{data}$ minus an average of the intermediate voltages $V_L$ and $V_R$ (alternatively, the adjacent $V_{smooth}$ voltages), which is generally a good approximation to $V_{data}$ minus $V_{smooth}$ if all the switches are closed. If one switch is open, the cell is at a step edge where an adjacent pixel is lower and circuit 40 will introduce a systematic offset that is equivalent (to first order) to raising $V_{data}$ at the pixel. This has a minor edge enhancement effect on the smooth voltage (on the high side of the step), but it may not be noticeable with large amounts of smoothing. If both switches are open, because of a single pixel bright spot against a dim background (as an outlier, for example), then $V_{smooth}$ can rise to the upper supply limit if transistor 47 is not able to sink the current through transistor 41b (or transistors 41b and 45b). If necessary, this anomaly can be corrected (or circumvented) by using the intermediate voltages as outputs to read one less pixel than the array size.

Although the present invention has been described with respect to specific embodiments thereof, various changes and modifications can be carried out by those skilled in the art without departing from the scope of the invention. For example, the embodiments described above can be implemented with various types of transistors, including an interchange of n-FET and p-FET transistors. Therefore, it is intended that the present invention encompass such changes and modifications as fall within the scope of the appended claims.

I claim:

1. A comparator circuit for a switched resistive network, comprising:

a current splitter circuit having a current input connected to a plurality of voltage comparators;

means for providing a reference voltage to said current splitter circuit and generating a reference output;

means for providing a plurality of voltage inputs from said switched resistive network, each of said comparators connected to receive at least one of said voltage inputs and to generate a corresponding comparator output;

a current mirror circuit connected to receive said reference output from said current splitter circuit and to generate a plurality of mirror outputs, each of said mirror outputs joined with a corresponding one of said plurality of comparator outputs; and means for connecting said plurality of joined mirror and comparator outputs to operate a corresponding plurality of switches in said switched resistive network.

2. The comparator circuit of claim 1, wherein each of said comparators comprises at least one field effect transistor having a source connected to receive said current input and a gate connected to receive one of said voltage inputs.

3. The comparator circuit of claim 2, wherein said reference voltage means comprises a field effect transistor having a gate connected to receive said reference voltage, a source connected to receive said current input, and a drain connected to provide said reference output to said current mirror circuit.

4. The comparator circuit of claim 3, further comprising means connected to said current splitter circuit and said mirror circuit for adjusting the threshold of said comparators.

5. The comparator circuit of claim 1, further comprising means connected to said mirror circuit for providing a transconductance output.

6. A voltage comparator circuit for a resistive network having a plurality of nodes connected with switches, comprising:

a plurality of voltage comparator transistors having a common-source connection to a current input;

a reference transistor having a source connected to said current input, a gate connected to a reference voltage, and a drain providing a reference output;

a plurality of voltage inputs from said resistive network, each of said voltage inputs connected to a gate of a corresponding one of said voltage comparator transistors;

means for providing a transconductance output of said comparator circuit to one of said nodes of said resistive network;

a current mirror circuit comprising a plurality of mirror transistors, each of said mirror transistors having a gate connected to receive said reference output and a drain connected to a drain of at least one of said comparator transistors to provide a comparator output; and means for providing each of said comparator outputs to operate a corresponding one of said switches of said resistive network.

7. The voltage comparator circuit of claim 6, wherein said reference transistor, said comparator transistors, and said mirror transistors comprise field effect transistors.

8. The voltage comparator circuit of claim 6, further comprising means connected to said comparator circuit for adjusting the threshold of said comparator transistors.

9. A voltage comparator circuit for a node of a switched resistive network, comprising:
- a current splitter circuit comprising a plurality of voltage comparator transistors having a common-source connection to a current input;
- a data transistor having a source connected to said current input, a gate connected to a data voltage, and a drain providing a reference output;
- a plurality of inputs comprising voltages from said resistive network, each of said voltage inputs connected to a gate of a corresponding one of said comparator transistors;
- a current mirror circuit comprising a plurality of mirror transistors, each of said mirror transistors having a gate connected to receive said reference output and a drain connected to a drain of at least one of said comparator transistors to provide a comparator output; and
- means for connecting said comparator outputs to operate a corresponding plurality of switches in said switched resistive network.

10. The voltage comparator circuit of claim 9, wherein said data transistor, said comparator transistors, and said mirror transistors comprise field effect transistors.

11. The voltage comparator circuit of claim 10, further comprising means connected to said comparator circuit for adjusting the threshold of said comparator transistors.

12. The voltage comparator circuit of claim 10, further comprising means connected to said comparator circuit for providing a transconductance output.

13. The voltage comparator circuit of claim 12, further comprising means for providing said transconductance output as a smoothing voltage to said node of said switched resistive network.

* * * * *